United States Patent
Daniel et al.

(10) Patent No.: US 11,555,830 B2
(45) Date of Patent: Jan. 17, 2023

(54) SMALL PITCH INTEGRATED KNIFE EDGE TEMPORARY BONDING MICROSTRUCTURES

(71) Applicant: HRL Laboratories, LLC, Malibu, CA (US)

(72) Inventors: Erik S. Daniel, Simi Valley, CA (US); Aurelio Lopez, Malibu, CA (US); Peter Brewer, Westlake, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 11 days.

(21) Appl. No.: 17/006,491

(22) Filed: Aug. 28, 2020

(65) Prior Publication Data

US 2021/0063439 A1    Mar. 4, 2021

Related U.S. Application Data

(60) Provisional application No. 62/893,650, filed on Aug. 29, 2019.

(51) Int. Cl.

| | |
|---|---|
| G01R 1/04 | (2006.01) |
| G01R 1/067 | (2006.01) |
| G01R 1/073 | (2006.01) |
| G01R 31/28 | (2006.01) |
| H01L 23/00 | (2006.01) |

(52) U.S. Cl.
CPC ..... *G01R 1/06744* (2013.01); *G01R 1/07371* (2013.01); *G01R 31/2887* (2013.01); *H01L 24/71* (2013.01); *H01L 24/89* (2013.01); *H01L 2224/80201* (2013.01)

(58) Field of Classification Search
CPC .......... G01R 1/04; G01R 1/067; G01R 1/073; G01R 31/02; G01R 31/28
See application file for complete search history.

(56) References Cited

U.S. PATENT DOCUMENTS

| 3,812,559 A | 5/1974 | Spindt | |
|---|---|---|---|
| 5,055,780 A * | 10/1991 | Takagi | G01R 1/04 |
| | | | 324/756.07 |

(Continued)

FOREIGN PATENT DOCUMENTS

WO    2010-141264 A1    12/2010

OTHER PUBLICATIONS

PCT International Search Report and Written Opinion from PCT/US2020/048553 dated Dec. 4, 2020.

(Continued)

*Primary Examiner* — Neel D Shah
(74) *Attorney, Agent, or Firm* — Ladas & Parry, LLP

(57) ABSTRACT

A temporary bond method and apparatus for allowing wafers, chips or chiplets. To be tested, the temporary bond method and apparatus comprising: a temporary connection apparatus having one of more knife-edged microstructures, wherein the temporary connection apparatus serves, in use, as a probe device for probing the chiplets, each chiplet including a die having one or more flat contact pads which mate with the one of more knife-edged microstructures of the temporary connection apparatus; a press apparatus for applying pressure between the one or more flat contact pads on the chiplet with the one of more knife-edged microstructures of the temporary connection apparatus thereby forming a temporary bond between the temporary connection pad with the knife-edged microstructure in contact with the one or more flat wafer pads; the press being able to apply a pressure to maintain the temporary bond connection during or prior to testing of the chiplet.

30 Claims, 6 Drawing Sheets

(56) References Cited

U.S. PATENT DOCUMENTS

| | | | |
|---|---|---|---|
| 5,160,779 | A | 11/1992 | Sugihara |
| 5,326,428 | A * | 7/1994 | Farnworth ......... G01R 1/07314 |
| | | | 205/123 |
| 6,296,171 | B1 * | 10/2001 | Hembree ............... B23K 20/10 |
| | | | 156/73.1 |
| 2007/0132097 | A1 | 6/2007 | Wark |
| 2013/0106453 | A1 | 5/2013 | Ikegami |
| 2016/0084882 | A1 | 3/2016 | Dang |
| 2017/0010315 | A1 | 1/2017 | Hironaka |

OTHER PUBLICATIONS

PCT International Preliminary Report on Patentability (Chapter II) from PCT/US2020/048553 dated May 6, 2021.

Anderson, et al., "Technique for Connecting Electrical Leads to Semiconductors" Journal of Applied Physics 28, 923 (1957), pp. 923-924.

Coucoulas, et al., "Compliant Bonding—A New Technique for Joining Microelectronic Components", IEEE Transactions on Electron Devices, vol. 15, No. 9, Sep. 1968, pp. 664-674.

"Image Reversal Resists and their Processing" (available at https://www.microchemicals.com/technical_information/image_reversal_resists.pdf), viewed Nov. 9, 2020.

"Probe Card" by MJC Micronics Japan Co., Ltd. (available at www.mjc.co.jp/en/products/semiconductor/probe_card.html), printed Nov. 9, 2020.

"Pyramid Probe Cards" by Cascade Microtech (available at www.cascademicrotech.com/files/PYRPROBE_APP.PDF), 2004.

"TPEGTM MEMS T4—Power Your Device" by Technoprobe (available at www.technoprobe.com/soluzione/tpeg-mems-t4-power-your-device), viewed Nov. 9, 2020.

"Vx-MP" by FormFactor (available at www.formfactor.com/product/probe-cards/foundry-logic/vx-mp/), viewed Nov. 9, 2020.

* cited by examiner

Murphy (Clustered Defect) Yield Model for Chiplets:

$$Y = \left(\frac{1 - e^{-AD}}{AD}\right)^2$$

D = Defect Density; A = Area

Poisson (Independent Defect) Model for Chiplet Integration
Max Chiplet Size = 1 cm²

Notional fine pitch probing station utilizing modified die bonder tool head and stage, with temporary connection made between pointed "probe" pads on the probe head to chiplet pads on a wafer, allowing fine-pitch (<10 μm) pad known-good-chiplet (KGC) testing

*Gold pad with three evaporated gold spike contacts.*

*Ten micron pitch daisy chain formed from low-temperature bonded arrays of pads with crossed spike contacts*

*Total measured series resistance vs chain length for four 150 x 150 arrays indicating 100% yield and uniform contact resistance of 130 mOhm.*

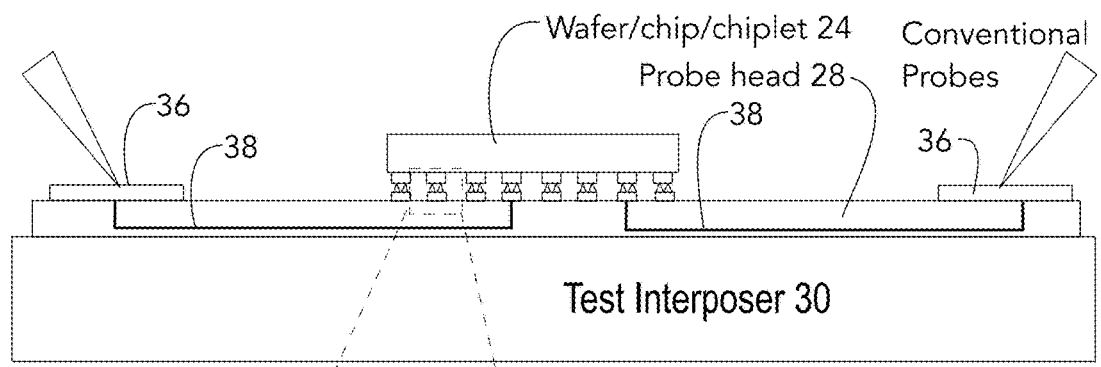
Fig. 4
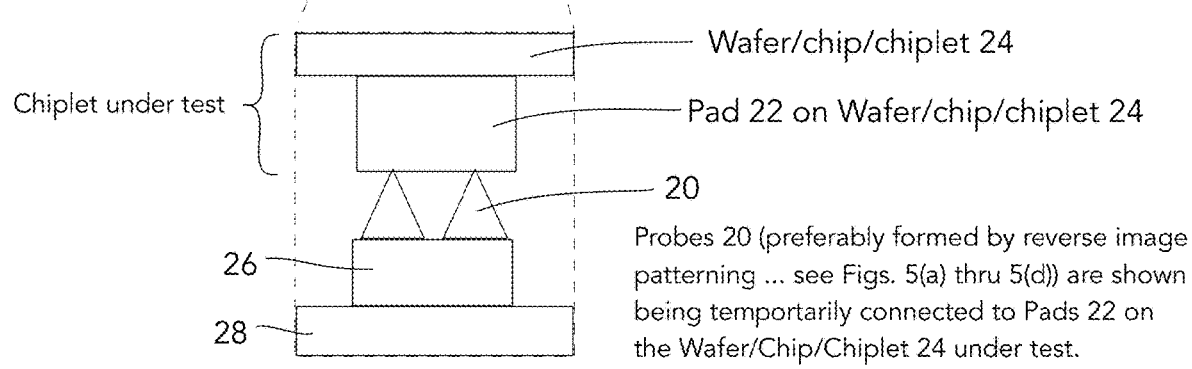
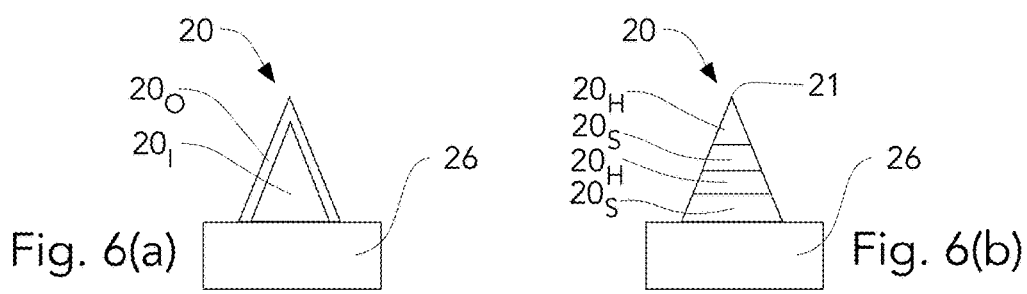
Fig. 6(a)    Fig. 6(b)

SMALL PITCH INTEGRATED KNIFE EDGE TEMPORARY BONDING MICROSTRUCTURES

CROSS REFERENCE TO A RELATED APPLICATION

This application claims the benefit of U.S. Provisional Patent Application Ser. No. 62/893,650 filed 29 Aug. 2019 and entitled "Small Pitch Integrated Knife Edge Temporary Bonding Microstructures", the disclosure of which is hereby incorporated herein by reference.

STATEMENT REGARDING FEDERALLY SPONSORED RESEARCH OR DEVELOPMENT

None.

TECHNICAL FIELD

This disclosure relates to a novel approach allowing Known Good Chiplet (KGC) testing to occur with IC wafers, chips, and/or chiplets having, for example, large numbers (>1000, and even >20,000) of very fine-pitch (typically ≤10 µm) interconnect pads.

BACKGROUND

Probe testing of IC chips is well known in the industry, but is limited to chips having rather large pitches (for example, ~50 µm or more) of its interconnection pads. Temporary aligned "tack" bonding of microelectronic parts, as disclosed herein, is not known in the art. 'Tack' bonding is a temporary bond that has the potential to be detached or to be made permanent. While low temperature (friction bonding, seizing, cold welding) solid-state bonding of metal surfaces has been well established and has been reported in the literature for over 50 years (even at cryogenic temperatures), a microfabrication process with fine-alignment (micron scale) capability at room temperature that allows inspection and rework, if needed, is lacking. See, for example, A. Coucoulas and B. H. Cranston, "Compliant Bonding—A New Technique for Joining Microelectronic Components", *IEEE Transactions on Electron Devices*, Vol. 15, No. 9, September 1968 and O. L. Anderson, H. Christensen, and P. Andreatch, "Technique for Connecting Electrical Leads to Semiconductors" *Journal of Applied Physics* 28, 923 (1957).

Prior art technologies, which are referred to as Tech I, Tech II, Tech III and Tech IV herein, may relate to the following (and not necessarily in this order): Cascade Microtech (see www.cascademicrotech.com/files/PYR-PROBE_APP.PDF); Technoprobe: (see www.technoprobe.com/soluzione/tpeg-mems-t4-power-your-device); Form-Factor: (see www.formfactor.com/product/probe-cards/foundry-logic/vx-mp); and MJC Cantilever (see www.mjc.co.jp/en/products/semiconductor/probe_card.html).

In this document novel knife-edge microstructure contacts are disclosed that enable high local pressures to be applied that form weak temporary bonds to be established at room temperatures or stronger bonds to be formed (if higher pressures and temperatures are used). These microstructures, shown in the accompanying drawing figures, may be fabricated using standard microfabrication processes and are easily integrated into CMOS or other device technology layout formats.

As mentioned above, probe testing is well known in the industry, but the Small Pitch Integrated Knife Edge (SPIKE) approach presented here is significantly different from traditional needle probe or area array (e.g. pyramid probe) technology with respect to design and implementation. It is not an obvious extension of probe testing technology or thermocompression bonding technology.

There has been some debate among those in the technical community as to whether 2D and 3D integration manufacturing will require known-good-die testing prior to integration, or whether the yield of unscreened (untested) dies will be high enough and the drop-out associated with the integration process low enough that integrated multi-die-module yield will be sufficient. It is not surprising that some raise this question, as in many cases in commercial industry today, unscreened dies are packaged and only screened following packaging. However, we maintain that, with both conventional fabrication and advanced 2D and 3D integration manufacturing, yield and associated cost will drive the necessity of die/chiplet screening when the total integrated die/chiplet area exceeds ~10 cm$^2$ (indeed, the economic impact of poor yield is one reason why commercial companies such as Xilinx, Intel, and NVIDIA are producing multi-chip processors integrated using interposer technology today). This point is illustrated in FIG. 1 and discussed in detail below.

Although exceptionally complex and detailed integrated circuit yield models can be developed that incorporate details of the process and associated yield limiters at every mask step, a simple commonly used yield model for semiconductor processes is the Murphy model (see the equation on FIG. 1), which depends only on an aggregated defect density associated with all mask steps (D) and the total die area (A). The Murphy model accounts for some degree of spatial correlation between defects, hence predicting a somewhat higher yield than an independent defect (Poisson) model. Assuming defects from chiplet to chiplet are independent, the yield of a complete module assembly with unscreened chiplets is simply the product of the yields of all of the individual chiplets multiplied by the integration yield for all chiplets (here we assume the same probability for successfully integrating each single chiplet, shown in the legend of FIG. 1, such that the total integration yield is the single chiplet yield to the power of the total number of chiplets). The cost multiplier (i.e., cost of producing a single fully functional module divided by the cost of producing a single untested module, or equivalently, the total number of modules, one must assemble in order to produce one functioning module on average) is simply the reciprocal of this overall yield product. For the plot shown, we assume a maximum chiplet size of 1 cm$^2$, but the curves are very weakly dependent on this choice (as a smaller chiplet size results in higher yield, but correspondingly more chiplets are needed to achieve the total desired chiplet area such that the total yield is roughly unchanged).

BRIEF DESCRIPTION OF THE INVENTION

This document discloses a method for creating a temporary electrical connection to a microelectronic component (e.g. a semiconductor die) with very fine-pitch interconnects (for example, an interconnect pitch of ≤10 µm). One important use case for such a technology is to perform electrical screening of semiconductor dies or other microelectronic components with very fine-pitch interconnects (≤10 µm pitch) in order to establish inventories of "known good die" (KGD) semiconductor modules or dies. The technology disclosed herein can be used with semiconductor dies or other microelectronic components having interconnects that are more widely spaced, if desired.

Another use for the technology disclosed herein involves temporary assembly of a number of dies into an integrated assembly, performing testing or use of the integrated assembly, then later replacing one or more die which may have been determined to have failed or degraded. In one embodiment, the disclosed method marries conventional wafer-probing techniques with die-bonding technology by using microfabrication of Small Pitch Integrated Knife Edge (SPIKE) probe "bumps" with shaped tips to allow fine-pitch probing or temporary attachments. The disclosed technology overcomes the limitation of conventional wafer-probing methods that generally only support much larger interconnect pitches (~50 μm or greater). For a die screening/probe use embodiment, a test fixture having a probe head with the microfabricated pointed SPIKE probe bumps is aligned to the die under test, preferably using a commercial precision die bonder (or a modest modification thereof), that enables the probe bumps to touch-down on contact pads and create a low resistance (≤1 Ohm for 5×5 μm² pads) contact between SPIKE bumps and interconnect bumps of the chiplet under test. The touch down process preferably does not form a strong metallurgical bond, and as such, the SPIKE and chiplet bumps can be easily disengaged following testing. In the temporary assembly use embodiment, the SPIKE probes make a small area weak metallurgical bond which does not require continual pressure (as in the die screening case), but which can be disengaged as needed from the contacts for rework of the integrated assembly by die replacement, or can be bonded with more force in order to form a more permanent, traditional metallurgical bond.

In order to form this weak metallurgical bond, the probe tips are preferably formed of metals like Ti or W or even Au or Al, so long as the metal selected for the probe tips is at least somewhat harder than the metal of contact pads, which may be formed, for example, of In, Al, Cu, or Au. So when compressive pressure is applied between probes and pads, they become physically connected . . . the bond that occurs (which we call a weak metallurgical bond) is not really a chemical bond, but something more like a physical restraint, which provides excellent ohmic contact, yet the physical restraint or weak metallurgical bond can be broken to allow rework of the integrated assembly.

One use of the technology disclosed herein is to form temporary bonds between stacked component pairs including die-to-die, die-to-wafer, and wafer-to-wafer configurations to allow alignment and quality inspection (and possibly also electrical testing) prior to permanent flip-chip bonding, and/or to allow characterization of temporary assemblies. The technology disclosed herein finds use in electronic packaging and integration applications, especially those that currently lack a temporary bonding technology to allow alignment inspection, and if necessary, repair, before final attachment, such as 3D and 2.5D integration, heterogeneous integration of diverse semiconductors, and hybridization processes. The temporary bonding technology disclosed herein can be performed at room temperature (for example, 23°±10° C. and better yet 23°±3° C. if in a climate-controlled environment). The advantages of temporary room temperature tack bonding include the following:

Enables >100× cost reduction for large multi-chip modules (>40 cm²).
Enables >5× reduction in the probe pitch <10 μm compared with SOTA commercial probing techniques.
Small pitch integrated knife edge (SPIKE) probe tips provide uniform low contact resistance across large arrays of bumps (>20,000) and for the purpose of this disclosure, a low contract resistance is less than 1 ohm. But even if the contact resistance were somewhat greater than 1 ohm, that would still be superior to other technologies.

In one aspect the presently disclosed technology provides an apparatus for making temporary bonds to connection pads on wafers, chips or chiplets during testing of same, the apparatus comprising: a probe head having a plurality of probes associated therewith, the plurality of probes each having sloping sidewalls that converge towards or arrive at least one point, ridge and/or other contact region, the probe head serving, in use, as a probe device for probing said wafers, chips or chiplets during the testing of same, each wafer, chip or chiplet including a surface with a plurality of connection pads thereon which each mate, during said testing, with a corresponding one or ones of the point(s), ridge(s) or other contact region(s) of the plurality of probes associated with the probe head; and a press apparatus for applying pressure between the plurality of connection pads on a wafer, chip or chiplet to be tested with the one of more probes of the probe head thereby forming a temporary bond connection between each of the plurality of connection pads and corresponding one or ones of the point(s), ridge(s) or other contact region(s) of the plurality of probes.

In another aspect the presently disclosed technology provides a bonding apparatus for forming removable or temporary connections between a testing fixture and a wafer, chip or chiplet, the wafer, chip or chiplet having a plurality of flat metallic pads coupled to circuits to be tested in the wafer, chip or chiplet, the temporary bond apparatus comprising: a plurality of knife-edge members disposed on said testing fixture pointing in a direction normal to a major axis of the testing fixture; and a press apparatus for imparting a compressive force between the knife-edged members and the plurality of flat wafer pads to thereby form, in use, a temporary electrical connection bond between (i) the plurality of flat wafer pads on the wafer, chip or chiplet to be tested and (ii) the plurality of knife-edge members.

The aforementioned bonding apparatus wherein, after circuits of the wafer, chip or chiplet have been tested and determined to be a good, the press apparatus imparts a greater compressive force between the knife-edged members and the plurality of flat wafer pads than was used initially to thereby form, in use, a high performance electrical connection bond between (i) the plurality of flat wafer pads on the wafer, chip or chiplet and (ii) the plurality of knife-edge members, the high performance electrical connection bond having a greater bonding strength than the temporary electrical connection bond.

In yet another aspect the presently disclosed technology provides a method of testing wafers, chips or chiplets using temporary bond connections, comprising forming a test apparatus comprising a plurality of members with sloping sidewalls pointing in a direction normal to a major axis of the test apparatus; applying a compressive force between the members with sloping sidewalls of the test apparatus and pads associated with a wafer, chip or chiplet under test to form temporary electrical connections between the members with sloping sidewalls of the test apparatus and pads associated with the wafer, chip or chiplet under test; and conducting tests of the circuity in the wafer, chip or chiplet under test, said tests including applying electrical signals to and/or sensing electrical signals in said wafer, chip or chiplet under test via said temporary electrical connections.

BRIEF DESCRIPTION OF THE DRAWINGS

FIG. 4 depicts an embodiment of a wafer, chip or chiplet probe arrangement which may be used for a known-good-chip or chiplet (KGC) process at a probing station.

FIGS. 6(a) and 6(b) each depict, in a cross-sectional views, a single probe having a relatively softer inner core with a relatively harder outer surface (see FIG. 6(a)) or a probe having alternating layers of relatively softer and relatively harder materials (see FIG. 6(b)).

DETAILED DESCRIPTION

Figure 1:
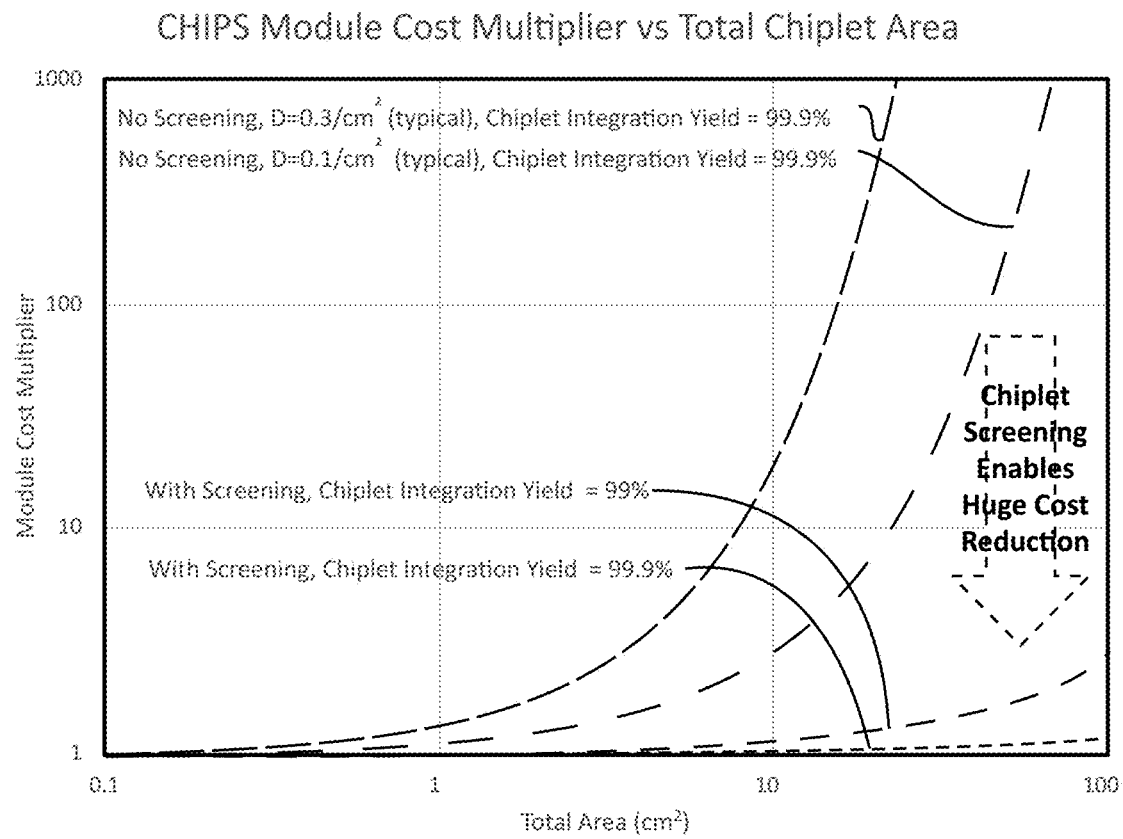
FIG. 1 presents a graph demonstrating an integrated module cost multiplier vs total chiplet area assuming a Murphy (clustered defect) model for chiplet fabrication yield and a Poisson (independent defect) model for chiplet integration yield.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

In the context of this document, the SPIKE concept is described primarily as a means for performing known-good-die testing for "chiplets", or die with very small, fine pitch pads. We envision that the same structures and roughly the same bonding approach could be used for a temporary assembly use embodiment.

We disclose herein a novel approach for performing known-good-chiplet (KGC) testing on chiplets with large numbers (>1000, and even >20,000) of very fine-pitch (≤10 μm) interconnect pads, reducing the cost of integrated circuits (ICs) or chip modules which comprise, for example, a large aggregate chiplet area (by a factor of 10× to 100×). The disclosed method leverages techniques we have developed for fabricating Small Pitch Integrated Knife-Edge (SPIKE) uniform pointed bumps on pads of this target pitch (and below) to develop a novel fine-pitch probing technology, representing a significant improvement over the existing state of the art (See Table I).

Table I (below) demonstrates that HRL probe technology (sometimes called SPIKE) disclosed herein offers a >5× reduction in pad pitch for area array probing compared with existing technologies (Tech I-Tech IV), while also supporting large numbers of contacts and low contact resistance.

| Metric | Tech I | Tech II | Tech III | Tech IV | HRL Probes 20 |
|---|---|---|---|---|---|
| Min Pad Pitch (μm) | 50 | 78 | 80 | 47 | ≤10 |
| Max Number of Contacts | >800 | >20,000 | >20,000 | ? | >20,000 |
| Contact Resistance (Ohm-μm$^2$) | 10-20 | 1500-3000 | ? | ? | 25 |
| Geometry | Area Array | Perimeter | Area Array | Perimeter | Area Array |

Figure 3A:
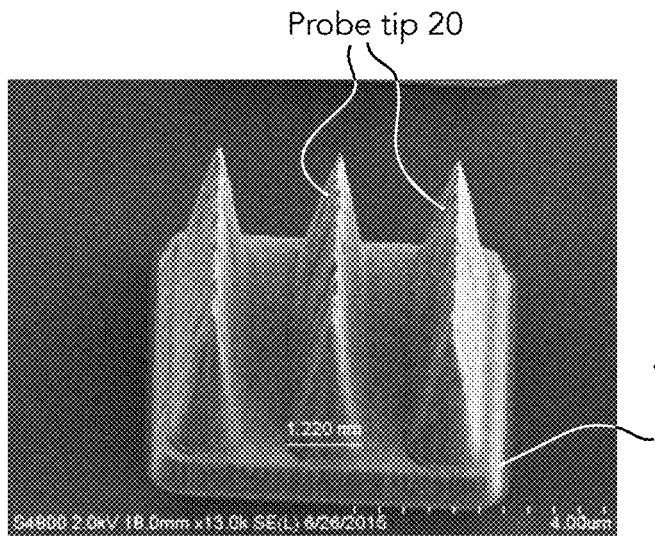
FIGS. 3(a)-3(c) depict a gold pad with three evaporated gold pointed or spike-like contacts (see FIG. 3(a)); a ten micron pitch daisy chain formed from low-temperature bonded arrays of pads with crossed spike contacts (see FIG. 3(b)); and a graph (see FIG. 3(c)) of measured series resistance vs chain length for four 150×150 arrays indicating 100% yield and an essentially uniform contact resistance of 130 mOhm (0.13 ohm per contact) based on four test results shown in FIG. 3(c).
Figure 3B:
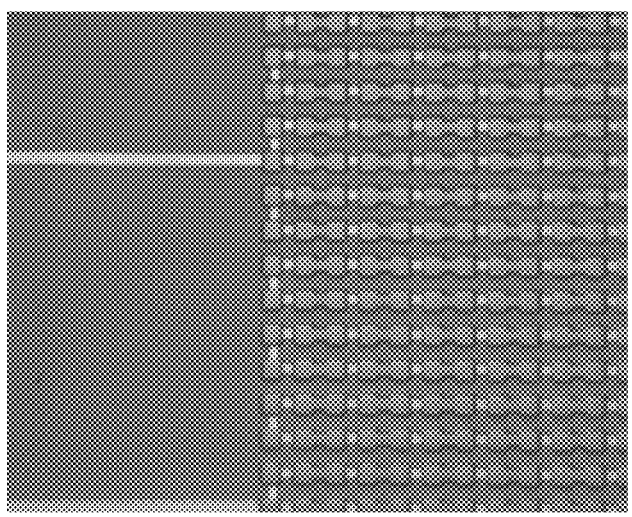
Figure 3C:
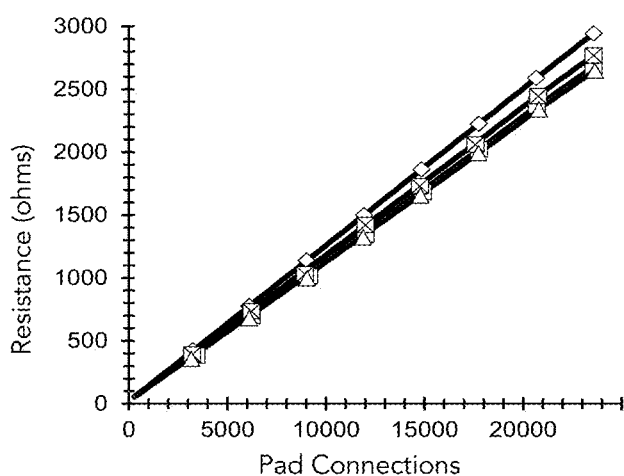

Considering the table set forth above, the HRL SPIKE technology (HRL Probes 20) disclosed herein meets a target specific contact resistance of <25 Ohm-μm$^2$ which is consistent with the data set forth in FIG. 3(c). FIG. 3(c) is a graph of measured series resistance vs chain length for four 150×150 arrays indicating 100% yield and an essentially uniform contact resistance of 130 mOhm (0.13 ohm per contact). Since the target of <25 Ohm-$\mu m^2$ equals, for a 5×5 $\mu m^2$ pad, <1 ohm per contact, obtaining a contact resistance of 0.13 ohm per contact means that the target has been exceeded by this technology.

As noted above, there has been some debate among those in the technical community as to whether a 2D or 3D integration manufacturing system will require known-good-die testing prior to integration, or whether the yield of unscreened die will be high enough and the drop-out associated with the integration process low enough that a 2D or 3D integration manufacturing system module yield will be sufficient.

We believe that, with both conventional fabrication and with a 2D or 3D integration manufacturing system, yield and associated cost will drive the necessity of die/chiplet screening when the total integrated die/chiplet area exceeds ~10 $cm^2$. This point is illustrated in FIG. 1 and discussed in greater detail below.

Although exceptionally complex and detailed integrated circuit yield models can be developed that incorporate details of the process and associated yield limiters at every mask step, a simple commonly used yield model for semiconductor processes is the Murphy model (see equation in FIG. 1), which depends only on an aggregated defect density associated with all mask steps (D) and the total die area (A). The Murphy model accounts for some degree of spatial correlation between defects, hence predicting a somewhat higher yield than an independent defect (Poisson) model. Assuming defects from chiplet to chiplet are independent, the yield of a complete module assembly with unscreened chiplets is simply the product of the yields of all of the individual chiplets multiplied by the integration yield for all chiplets (here we assume the same probability for successfully integrating each single chiplet, shown in the legend of FIG. 1, such that the total integration yield is the single chiplet yield to the power of the total number of chiplets). The cost multiplier (i.e., cost of producing a single fully functional module divided by the cost of producing a single untested module, or equivalently, the total number of modules, one must assemble in order to produce one functioning module on average) is simply the reciprocal of this overall yield product. For the plot shown, we assume a maximum chiplet size of 1 $cm^2$, but the curves are very weakly dependent on this choice (as a smaller chiplet size results in higher yield, but correspondingly more chiplets are needed to achieve the total desired chiplet area such that the total yield is roughly unchanged).

For typical or even very aggressive defect densities for advanced semiconductor (e.g., CMOS) processes (0.1-0.3/$cm^2$), single-die yield begins to drop off significantly (75% to 90%) once the die area exceeds 1 $cm^2$. As a result, the cost multiplier without die screening becomes prohibitive even for modest total chiplet areas, (e.g., a 10× cost results from a 7.8 $cm^2$ total chiplet area with a 0.3/$cm^2$ defect density, or a 23.4 $cm^2$ total chiplet area with a 0.1/$cm^2$ defect density). By comparison, the cost multiplier resulting from even a relatively modest per-chiplet integration yield (99% to 99.9%) is correspondingly very low. Therefore, once total chiplet areas exceed roughly 10 $cm^2$, known-good-chiplet (KGC) screening (testing) becomes important in order to manage cost by ensuring that semiconductor wafers/chips/chiplets are in fact good (KGC) before incorporating the wafer/chip/chiplet into some apparatus under fabrication. In fact, as can be seen from FIG. 1, even if the cost of performing KGC screening were to become several times the cost of producing a single integrated module, at a large enough total chiplet area, cost considerations associated with utilizing a faulty wafer/chip/chiplet would still make KGC screening cost-beneficial.

For conventional semiconductor dies (chips), a number of probing technologies exist today, including various forms of DC and microwave "wedge" probes for peripheral contacts, and products such as Cascade Microtech's Pyramid Probe cards (which use microformed probe tips on a flex substrate) for area array probing. However, these technologies are generally limited to fairly large pitch 50 $\mu m$) interconnect pads and some are also limited to relatively small numbers of connections (~100-200). See, for example, "Pyramid Probe Cards" by Cascade Microtech (available at www.cascademicrotech.com/files/PYRPROBE_APP.PDF); "TPEG™ MEMS T4—POWER YOUR DEVICE" by Technoprobe (available at www.technoprobe.com/soluzione/tpeg-mems-t4-power-your-device/); "Vx-MP" by FormFactor (available at www.formfactor.com/product/probe-cards/foundry-logic/vx-mp/); and "Probe Card" by MJC Micronics Japan Co., Ltd. (available at www.mjc.co.jp/en/products/semiconductor/probe_card.html).

In the long term, for high volume production, a KGC probing solution (see FIG. 2) is envisioned that combines the best features of probe card technology with many of the features of a conventional die bonder (e.g. precise placement accuracy and application of mating force), and utilizing shaped (pointed) fine pitch bumps as probe tips 20 to be temporarily mated with the fine pitch chiplet pads 22 on a wafer/chip/chiplet 24 under test. The probes 20 have tapered edges which may be formed to a point or may take on a wedge shape formed to a ridge as shown in FIG. 3(a). The tapered edges or slopes on the probes 20 may be formed using techniques known in the art. See, for example, "Image Reversal Resists and their Processing" (copy attached as Appendix A hereto) for a discussion of one way to form pointed, spike-like or knife-edge shaped members having tapered sidewalls using image reversal technology). If the deposition of the metal shown in FIG. 107 in Appendix A is continued, the resulting probes 20 may have a sharp knife-like distal edges or points as opposed to the blunter edge or point shown in Appendix A. Those practicing the present technology may choose to use the pointed, spike-like or knife-edge shaped probes 20 disclosed herein, but it should be understood that the probes 20 may alternatively be somewhat blunter thereby having contact regions which are less pointed or knife-like than the probes 20 depicted herein.

A successful method of contacting and testing fine-pitch (≤10 $\mu m$) pads on chiplet die and/or wafers should satisfy a number of criteria:

1. Electrical connection between the entire array of pads on a wafer/chip/chiplet under test and probe pads must be made reliably with relatively low electrical resistance (preferably <1 Ohm for each individual chiplet pad).

2. It must be possible to disengage the probe pads reasonably easily from the pads on the wafer/chip/chiplet under test.

3. Following probing, the pads on the tested wafer/chip/chiplet must still support reliable permanent packaging—any damage to the chiplet pads must not impede subsequent permanent integration (e.g., bump bonding onto an interposer, for example).

4. The probe pads must survive a relatively large number of matings with different sets of pads on the wafer/chip/chiplet under test (e.g., >100 matings and preferably many more matings) before they need replacement.

5. There must be a method of aligning and manipulating the fine-pitch (10 μm) probe pads into contact with the corresponding pads on the wafer/chip/chiplet under test, while maintaining pad registration across the entire wafer/chip/chiplet area.

Using evaporated metal deposition (typically Ti, Au or Al) and lift-off lithography (see Appendix A for example), we have demonstrated the ability to fabricate very uniform arrays of tall (several microns high) pointed tips on ten micron pitch bump or probe 20 arrays. In order to make the tips of probes 20 more robust, we recommend adding a coating of tungsten or nickel layer to the probes 20 (see FIG. 6). The wafers/chips/chiplets under test 24 use conventional Au or Au—Sn pads 22 preferably with a flat surface profile. We expect the harder probe tips suggested above (with a layer or coating of tungsten or nickel) to enter slightly into the pads 22 when compressive pressure is applied by the bonding equipment, thus making electrical contact between probes 20 and pads 22 during testing, but preferably not making a metallurgical bond between the two (as with conventional bump bonding) and not precluding detachment of the wafers/chips/chiplets under test 24 after testing is completed or subsequent permanent bonding of the tested (and good) wafers/chips/chiplets 24 into some apparatus utilizing same.

Multiple probes 20 may be formed on a base or pad 26 and therefor are electrically connected in common to test apparatus via the base or pad 26 and a conductor 38. The multiple probes 20 of FIG. 3(a) are sized to mate temporarily with a single pad 22 on the wafer/chip/chiplet to be tested. A wafer typically is several inches in diameter and many chips (or chiplets) are formed from a single wafer. The term "chip" refers to a single integrated circuit or IC. The term "chiplet" refers to an integrated circuit or IC which may be packaged or combined with other chiplets to form a single integrated circuit or IC. The testing disclosed herein may be done on a wafer-by-wafer basis or a chip-by-chip basis or a chiplet-by-chiplet basis. If done on a wafer-by-wafer basis then all chips embodied in the wafer may be tested simultaneously or a subset thereof may be tested at some instant in time. If done on a chip-by-chip basis or on a chiplet-by-chiplet basis it is preferred that the chips or chiplets remain attached to each other in the wafer so as to reduce the amount of set up work which would be with the die bonder. Of course, if all chips or chiplets on a wafer are to be tested simultaneously, then the probe head 28 should be sized so that multiple arrays of probes 20 can make contact with corresponding multiple arrays of pads 22, each such array typically being then associated with a single chip or chiplet in the wafer.

An array of probe pads 20 may be fabricated on probe head 28 which is preferably constructed as a replaceable unit (a temporary testing fixture) attached to an interposer 30 to which a wafer/chip/chiplet 24 under test may be temporarily attached using the apparatuses and processes disclosed herein. The probes 20 are mated with the fine-pitch chiplet pad 22 pattern, under compression, using, for example, a FC300 die bonder made by Smart Equipment Technologies (SET Corporation SA) of Saint Jeoire, France, to apply a compressive force between its upper head (or tool head 12) and its lower stage 14 thereby applying a compressive force between probes 20 and the pads 22 with which they mate during testing of wafer/chip/chiplet 24. The die bonder functions as a press apparatus and, of course, other apparatuses may be used instead to apply a compressive force between the array of probes 20 and a corresponding pattern (or array) 22 of the fine-pitch wafer/chip/chiplet 24 pads 22. The interposer 30 may distribute electrical connections from the pattern or array of the fine-pitch chiplet pads 22 via probes 20 and probe head 28 to an arrangement of conventional probe pads 36, preferably disposed at periphery of the interposer 30 (see FIG. 2). In some embodiments, the arrangement of conventional probe pads 36 may be located elsewhere such as at the periphery of the probe head 28 (see FIG. 4). The conventional probe pads 36 are typically arranged on a much larger (relatively coarse, conventional) pitch compared to the fine-pitch pad pattern used on the wafer/chip/chiplet 24 under test, thereby allowing chiplet testing using conventional probes and probe station hardware to interface with the conventional, coarse pitch probe pad pattern 36, and conduct whatever testing is desired for the wafer/chip/chiplet 24 to ensure that it is KGC before being more or less permanently affixed to some apparatus being constructed that utilizes the wafer/chip/chiplet 24.

Figure 2:
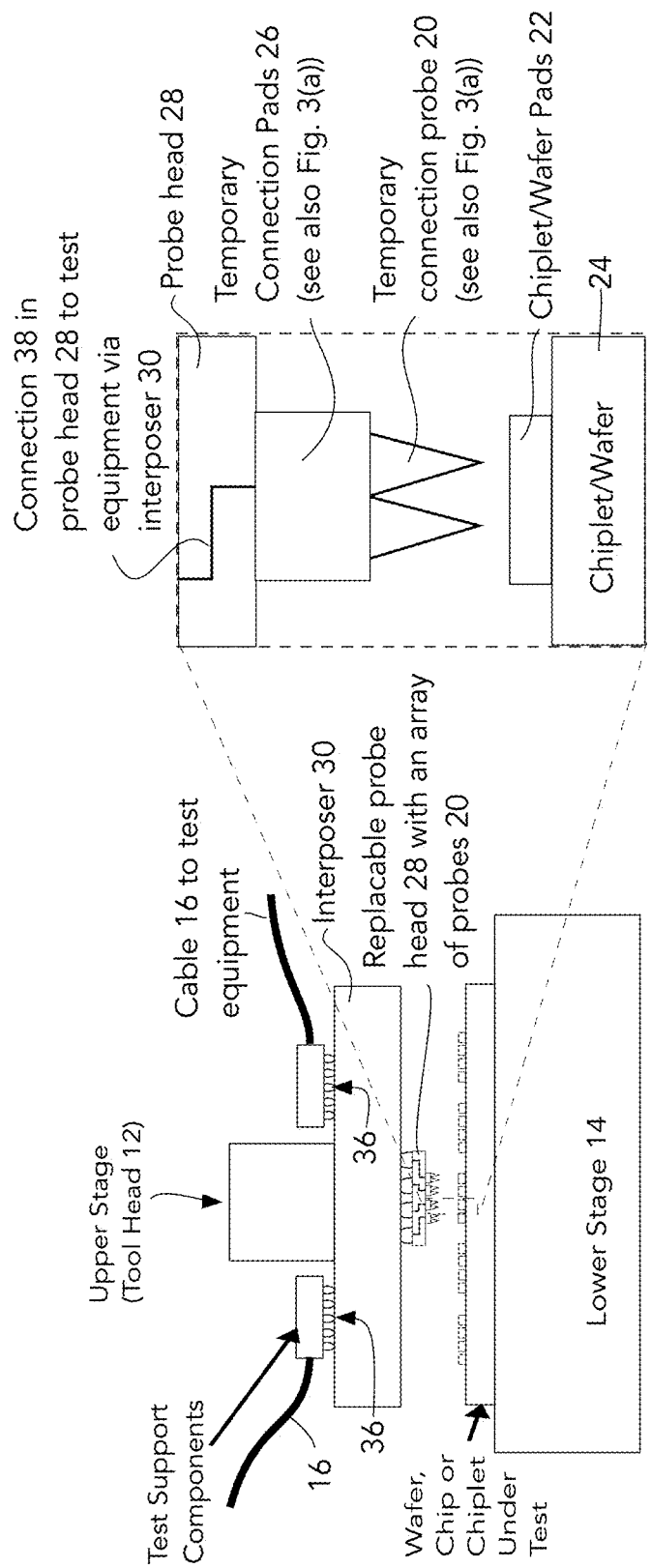
FIG. 2 provides a schematic diagram of a fine pitch probing station preferably utilizing a slightly modified die bonder with an upper stage (a tool head with a probe head attached) and a lower stage (to which the wafer or chiplet under test is attached) so that a temporary connection may be made between pointed (spiked) "probe" pads on the probe head and pads on a wafer, chip or chiplet, allowing fine-pitch (<10 μm) pad known-good-chiplet (KGC) testing. The modifications to a state-of-the-art die bonder preferably include hardware and recipe (software) changes. The hardware changes are those that are shown in FIG. 2 between the upper and lower stages and the recipe for the bonder is preferably changed so that after probing the probe head keeps being held on the upper stage. The bonder would leave the bonded chip on the mating part (by releasing vacuum).

FIG. 4 is similar in many regards to the embodiment of FIG. 2, but in the embodiment of FIG. 4, the pads 36 are disposed on the probe head 28. Exemplary connections 38 between pads 36 (for the test equipment) and the probes 20 (for the wafer/chip/chiplet 24 under test) are shown and none is needed within or on the interposer 30 in this embodiment. Also, in FIG. 4, the elements of the die bonder (the upper stage 12 and lower stage 14) which apply pressure between the interposer 30 and the wafer or chiplet under test 24 are omitted thereby allowing FIG. 4 to better depict the probes 20.

Figure 4A:
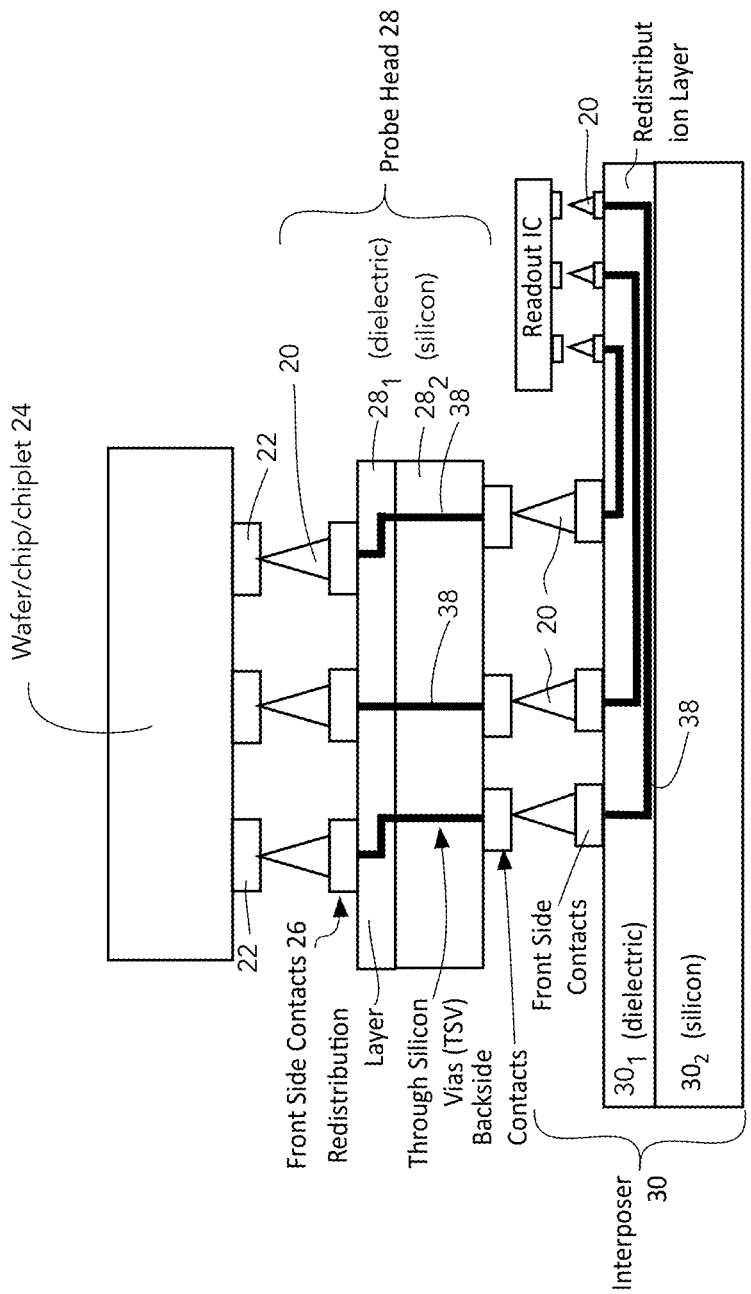
FIG. 4A depicts another embodiment of a wafer, chip or chiplet probe arrangement which may be used for a known-good-chip or chiplet (KGC) process at a probing station.

FIG. 4A presents yet another embodiment of the probes 20, associated pads 26, probe head 28 and interposer 30, but in this embodiment probes 20 are utilized not only to make contact to the pads 22 on the wafer/chip/chiplet 24 under test, but also (i) to make conductive contacts between the (replaceable, in this embodiment) probe head 28 and interposer 30 and (ii) to make conductive contacts between the interposer 30 and a laterally disposed readout IC, which is utilized in this embodiment in lieu of the pads 36 of the embodiment of FIG. 4. The readout IC performs the function of the test equipment mentioned above. Also, as in FIG. 4, the elements of the die bonder (the upper stage 12 and lower stage 14) which apply pressure between the interposer 30 and the wafer or chiplet under test 24 are omitted thereby allowing FIG. 4A to better depict the probes 20 and the additional uses therefor.

Those skilled in the art should now recognize that the probes 20 can be used in a number of different ways and that the apparatus used to test the wafer/chip/chiplet 24 can take several different forms and yet additional forms beyond those depicted in FIGS. 2, 4 and 4A will now suggest themselves to those skilled in the art.

One embodiment of a process flow for fabricating probes 20 is shown in FIGS. 5(a)-5(d). The probes 20 are preferably embodied as a knife-edge microstructures. But the probes 20 need not necessarily end in a pointed or knife-edge end, but may be somewhat blunter, if desired. An important factor in controlling the knife-edge probe structure is the reentrant photoresist 40 (see FIG. 5(b)) profile (using image reversal lithography) and the geometric spread of an evaporation or sputter source during deposition of the probes 20. See Appendix A for a discussion of Image Reversal Lithography. The height of the knife-edge probe microstructure can be designed over a wide range (<1 μm-10 μm for example) depending on the linewidth opening G size in the resist 40 (see FIG. 5(b)). The probes 20 can be made blunter and less knife-edge-like by reducing the amount of material (see metal 42 in FIG. 5(c)) deposited during their formation.

The probe fabrication process employs standard semiconductor fabrication processes starting with a substrate, such as substrate $28_1$ or $30_1$ having a dielectric layer, such as dielectric layer 282 or $30_2$, disposed or formed thereon. Since the probes 20 may be utilized with either or both the probe head 28 and/or the interposer 30, both possibilities are described here since the same process flow may be used with either one or both, as desired. See FIG. 5(a). The substrate $28_1$ or $30_1$ is preferably formed of silicon because it is mechanically strong and also due to its low cost. The substrate $28_1$ or $30_1$ and the dielectric layer 282 or $30_2$ form either the probe head 28 (see the embodiments of FIGS. 2, 4 and 4A) or the interposer 30 (see the embodiment of FIG. 4A).

Figure 5A:
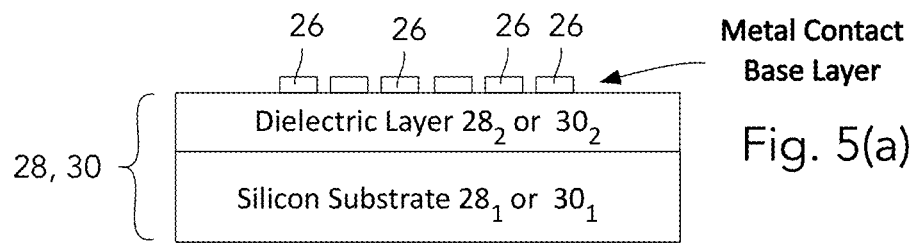
FIGS. 5(a)-5(d) depict an embodiment of a process for the fabrication of the probe structures disclosed herein, the process utilizing standard microfabrication processes; the height of the knife-edge probe microstructures is controlled by the resist pattern openings; typically this can be varied to create probes with heights ranging from <1 μm to >10 μm.

A metal (typically Ti, Au or Al) contact layer is deposited and formed into an array of probe pads 26 using a patterned resist (not shown) or alternatively the resist may be deposited first, then patterned and then depositing the metal contact layer with the probe pads 26 then being formed by a lift off process. Not shown in FIG. 5(a) is additional metal preferably formed at the same time probe pads 26 are formed, the additional metal forming, for example, the coarse pitch probe pad pattern 36 (if utilized) and possibly also all or of a portions of conductors 38 which provide connections between pads 36 (if used, for the test equipment) and the probes 20 (for the wafer/chip/chiplet 24 under test and elsewhere in some embodiments) since those are easily formed using standard semiconductor fabrication processes. Also not shown are buried conductors 38 or the vertical vias though silicon for conductors 38 or the redistribution layer also for conductors 38 depicted in prior figures which may also be easily formed using standard semiconductor fabrication processes. These details are not shown in FIGS. 5(a)-5(d) since those figures are intended to teach a method of making the knife-edge probes 20.

Figure 5B:
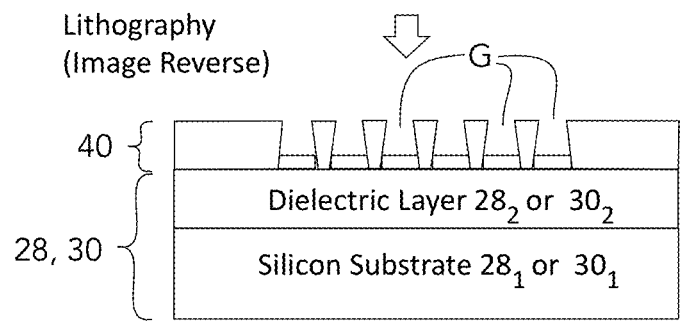
Figure 5C:
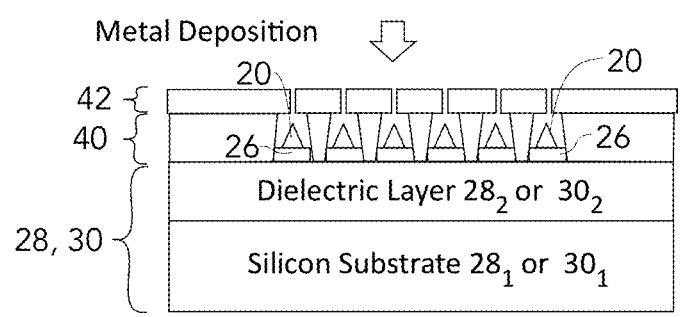

After the probe pads 26 are formed as shown in FIG. 5(a), a re-entrant resist layer 40 is formed (see FIG. 5(b)) on dielectric layer 282 or $30_2$ and patterned with sloping side walls (due to undercutting of the resist 40) leaving an opening or gap G opening therein above each probe pad 26 at the top of the layer of resist 40. As mentioned above, the size (linewidth) of the opening or gap G will affect the height of the soon to be deposited probes 20. In FIG. 5(c), each pad 26 is depicted with a single probe 20. This embodiment can be easily modified (by making the probe pads 26 wider, so that a single probe pad 26 can accommodate multiple probes 20 as is depicted by FIGS. 2 and 4.

Turning to FIG. 5(c), metal 42 (typically Ti, Au, Pd or Al) is then deposited, preferably by evaporation, on the structure depicted by FIG. 5(b). Much of the deposited metal 42 ends up on resist 40, but some of the metal 42 transits the openings or gaps G in resist 40 forming metal probes 20 with sloping sidewalls. The metal probes 20 are formed from metal 42 on each of the probe pads 26 exposed via openings or gaps G in resist 40.

Metal 42 may start out being Au or Al as mentioned above, but change to tungsten or nickel towards the end of the deposition process so that the probes end up with a thin layer of tungsten or nickel on them to make them more robust as suggested above. FIG. 6(a) depicts, in a cross-sectional view, a single probe 20 having a relatively softer inner core $20_I$ (made of Au or Al, for example) and relatively harder outer surface $20_O$ (made of Ti or W, for example). These materials may be reversed with the inner core $20_I$ made of a relatively harder material and having outer surface $20_O$ made of a relatively softer material.

Alternatively, probe 20 may be formed of a stack of layers (see, for example, the embodiment of FIG. 6(b)) of a relatively harder material $20_H$, for example, alternating with layers of a relatively softer material $20_S$. So the stack embodiment of probe 20 may comprise layers of different materials, such as Ti/Au/Ti/Au. Furthermore, the stack embodiment of FIG. 6(b) may be utilized as inner core $20_I$ of probe 20 as depicted by FIG. 6(a), in which case the stack of materials of FIG. 6(b) is covered with an outer surface $20_O$ as is the case with the embodiment of FIG. 6(a). The outer surface $20_O$ may similarly be defined as a stack of materials similar to that shown in FIG. 6(b). So there are many ways in which a number of different materials having differing hardnesses (moduli of elasticity) can give rise to a probe 20 having a desired modulus of elasticity. The modulus of elasticity governs the contact properties of the probes 20. Typically, it is the metal contact pad 22 of the wafer/chip/chiplet 24 under test that determines what material is desirously used for the probes 20. Moreover, one would typically desire a sufficiently hard probe 20 so that it plastically deforms the contact pad 22. We found that layered metal structures (see FIG. 6(b)) with alternating hard metals $20_H$ and soft metals $20_S$ so that the tip or pointed end 21 of a probe 20, formed of Ti or Ni for example, would initially indent the contact pad 22 and then the softer body portions $20_S$, formed of Al or Au, for example, of probe 20 would spread out when the compressive force is applied by the die bonder.

Figure 5D:
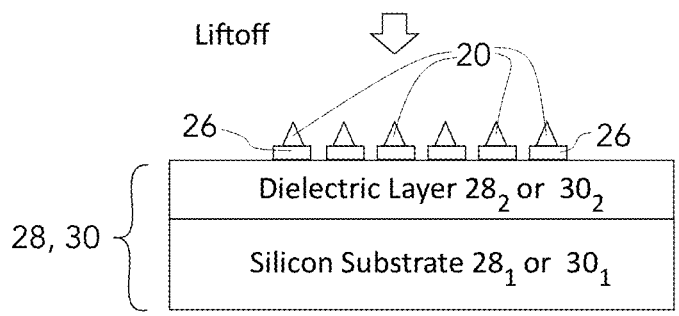

Turning again to FIG. 5(c), the metal 42 on resist 40 as well as resist 40 is removed by dissolving resist 40 in a liftoff process, exposing the probes 20 as depicted by FIG. 5(d), for example.

Having now described this technology in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, Paragraph 6, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An apparatus for making temporary bonds to connection pads on wafers, chips or chiplets during testing of same, the apparatus comprising:
   a probe head or interposer having a plurality of metallic probes disposed on a common major surface of a body of dielectric material, the plurality of probes each having sloping sidewalls that converge towards or arrive at at least one point, ridge and/or other contact region, the probe head or interposer serving, in use, as a device for connecting with said wafers, chips or chiplets during the testing of same, each wafer, chip or chiplet including a surface with a plurality of connection pads thereon which each mate, during said testing, with a corresponding one or ones of the point(s), ridge(s) or other contact region(s) of the plurality of probes associated with the probe head or interposer, the body of dielectric material having a plurality of conductive interconnects embedded therein, the embedded interconnects coupling at one end thereof with at least selected ones of said metallic probes; and
   a press apparatus for applying pressure between the plurality of connection pads on a wafer, chip or chiplet to be tested with the one of more probes of the probe head or interposer thereby forming a temporary bond connection between the plurality of connection pads and corresponding one or ones of the point(s), ridge(s) or other contact region(s) of the plurality of probes.

2. The apparatus of claim 1 wherein the press apparatus includes means for applying pressure to maintain the temporary bond connection during testing of the wafer, chip or chiplet or to form temporary metallurgical bonds between the plurality of connection pads and the corresponding one or ones of the point(s), ridge(s) or other contact region(s) of the plurality of probes.

3. The apparatus of claim 1 wherein the probes with sloping sidewalls are defined by knife-edged microstructures which project, in use, in a direction normal to a major plane defined by at least one of the connection pads on the wafer, chip or chiplet to be tested.

4. The apparatus of claim 3 wherein the knife-edged microstructures have an inner core of a relatively soft conductive material and an outer coating or layer of a relatively hard conductive material disposed on said inner core.

5. The apparatus of claim 4 wherein the temporary bond connection has an ohmic resistance of less than one ohm.

6. The apparatus of claim 3 wherein the knife-edged microstructures have a body core of a relatively soft conductive material and tip end of a relatively hard conductive material disposed on said body.

7. The apparatus of claim 1 wherein the press apparatus is a conventional die bonder.

8. The apparatus of claim 1 wherein the probe head or interposer has first and second major surfaces and wherein the plurality of probes are disposed on a first major surface of the probe head or interposer and wherein a plurality of connection pads are disposed on said second major surface, the plurality of connection pads disposed on said second major surface being interconnected with the plurality of probes disposed on said first major surface via said conductive interconnects embedded in said body of dielectric material.

9. The apparatus of claim 1 wherein the probe head or interposer has first and second major surfaces and wherein the first mentioned plurality of probes are disposed on a first major surface of the probe head or interposer and wherein a second plurality of probes are disposed on said first major surface laterally spaced a distance from the first mentioned plurality of probes, the second plurality of connection pads disposed on said first major surface being laterally interconnected with the first mentioned plurality of probes disposed on said first major surface via said metal conductors in said body of dielectric material.

10. The apparatus of claim 9 wherein the first mentioned plurality of probes is adapted for connection to the pads on wafers, chips or chiplets during testing of same while the second plurality of probes and the metal conductors in said body of dielectric material is adapted for connection to a readout chip whereby the pads on wafers, chips or chiplets and the readout chip are directly connected via the apparatus during said testing.

11. The apparatus of claim 1 wherein the common major surface of the body of dielectric material is a planar surface.

12. A temporary bond apparatus for forming removable and/or temporary connections to a wafer, chip or chiplet, the wafer, chip or chiplet having a plurality of flat metallic pads coupled to circuits to be tested in the wafer, chip or chiplet, the temporary bond apparatus comprising:
   a plurality of knife-edge members disposed on a dielectric surface of the temporary bond apparatus and pointing in a direction normal to the dielectric surface of the temporary bond apparatus, the dielectric surface being defined on a body of dielectric material of the temporary bond apparatus, the body of dielectric material having a plurality conductors embedded therein connecting with at least selected ones of the of knife-edge plurality members; and
   a press apparatus for imparting a compressive force between the knife-edged members and the plurality of flat wafer pads to thereby form, in use, a temporary electrical connection bond between (i) the plurality of flat wafer pads on the wafer, chip or chiplet to be tested and (ii) the plurality of knife-edge members.

13. The temporary bond apparatus according to claim 12 wherein a number of the knife-edge members is greater than a number of the flat wafer pads.

14. The temporary bond apparatus according to claim 12 wherein the temporary electrical connection bond is a temporary tack bond having a resistance of no more than 1 Ohm.

15. The temporary bond apparatus according to claim 12 wherein said knife-edge member comprise an inner core of a relatively soft metallic material and an outer layer of a relatively harder metallic material disposed on the relatively soft metallic material.

16. The temporary bond apparatus according to claim 12 wherein the temporary electrical connection bond is a temporary metallurgical bond that can be overcome without damage to the circuits in the wafer, chip or chiplet wafer, chip or chiplet.

17. The temporary bond apparatus according to claim 16 wherein, after the circuits of the wafer, chip or chiplet have been tested and determined to be good, the press apparatus imparts a greater compressive force between the knife-edged members and the plurality of flat wafer pads than was used initially to thereby form, in use, a high performance electrical connection bond between (i) the plurality of flat wafer pads on the wafer, chip or chiplet and (ii) the plurality of knife-edge members, the high performance electrical connection bond having a greater bonding strength than the temporary electrical connection bond.

18. The temporary bond apparatus according to claim 12 wherein the temporary electrical connection bond is a contact (non-metallurgical) bond.

19. The temporary bond apparatus of claim 12 wherein the dielectric surface of the temporary bond apparatus is essentially planar and wherein the plurality of knife-edge members is disposed on connection pads disposed on an essentially planar dielectric surface of the temporary bond apparatus.

20. A method of testing wafers, chips or chiplets using temporary bond connections, comprising
   a. forming a test apparatus comprising a plurality of members with sloping sidewalls pointing in a direction normal to a major axis of the test apparatus, the test apparatus also having a layer of dielectric material with conductors embedded therein, the conductors in the dielectric material being ohmically coupled with the members having sloping side walls;
   b. applying a compressive force between the members with sloping sidewalls of the test apparatus and pads associated with a wafer, chip or chiplet under test to form temporary electrical connections between the members with sloping sidewalls of the test apparatus and pads associated with the wafer, chip or chiplet under test;
   c. conducting tests of the circuitry in the wafer, chip or chiplet under test, said tests including applying electrical signals to and/or sensing electrical signals in said wafer, chip or chiplet under test via said temporary electrical connections.

21. The method of claim 20 wherein the members with sloping sidewalls define knife-like microstructures disposed on said layer of dielectric material.

22. The method of claim 21 wherein said knife-like microstructures comprise a body of a relatively soft metallic material and a tip of a relatively harder metallic material disposed on the relatively soft metallic material.

23. The method of claim 22 wherein a plurality tips of the knife-edge microstructures contact as least one of the pads associated with the wafer, chip or chiplet under test.

24. The method of claim 22 wherein a plurality tips of the knife-edge microstructures contact corresponding ones of the pads associated with the wafer, chip or chiplet under test.

25. The method of claim 21 wherein a number of the knife-edge microstructures is greater than a number of the pads associated with the wafer, chip or chiplet under test.

26. The method of claim 20 wherein the test apparatus includes a probe head having the plurality of members with sloping sidewalls disposed thereon, the plurality of members pointing in a direction normal to a major axis of the probe head.

27. The method of claim 26 wherein the test apparatus further includes an interposer disposed between the between the probe head and a portion of a die bonder, the die bonder applying the compressive force between the members with sloping sidewalls of the test apparatus and pads associated with the wafer, chip or chiplet under test.

28. The method of claim 20 wherein the layer of dielectric material with conductors embedded therein has an essentially planar surface and wherein the plurality of members with sloping sidewalls pointing in a direction normal to a major axis of the test apparatus is disposed on said essentially planar surface of said layer of dielectric material.

29. An apparatus for making temporary bonds to connection pads on wafers, chips or chiplets during testing of same utilizing a remotely located testing device, the apparatus comprising:
   a probe head and/or interposer having a plurality of metallic probes disposed on a common major surface of a body of dielectric material, the plurality of probes each having sloping sidewalls that converge towards or arrive at at least one point, ridge and/or other contact region, the probe head and/or interposer serving, in use, as a device for connecting with said wafers, chips or chiplets during the testing of same, each wafer, chip or chiplet including a surface with a plurality of connection pads thereon which each mate, during said testing, with a corresponding one or ones of the point(s), ridge(s) or other contact region(s) of the plurality of probes associated with the probe head and/or interposer, the body of dielectric material having a plurality of conductive interconnects embedded therein, the embedded interconnects laterally coupling at one end thereof at least selected ones of said metallic probes with said remotely located testing device; and
   a press apparatus for applying pressure between the plurality of connection pads on a wafer, chip or chiplet to be tested with the one of more probes of the probe head or interposer thereby forming a temporary bond connection between the plurality of connection pads and corresponding one or ones of the point(s), ridge(s) or other contact region(s) of the plurality of probes.

30. The apparatus for making temporary bonds according to claim 29 wherein the remotely located testing device includes or is embodied by a readout IC.

* * * * *